United States Patent
Brennan

(10) Patent No.: US 6,620,727 B2
(45) Date of Patent: Sep. 16, 2003

(54) ALUMINUM HARDMASK FOR DIELECTRIC ETCH

(75) Inventor: Kenneth D. Brennan, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/935,450

(22) Filed: Aug. 23, 2001

(65) Prior Publication Data

US 2003/0040172 A1 Feb. 27, 2003

(51) Int. Cl.$^7$ .................. H01L 21/4763; H01L 21/44
(52) U.S. Cl. .................. 438/637; 438/618; 438/622; 438/640; 438/652; 438/653; 438/687
(58) Field of Search .................. 438/618, 622, 438/637, 638, 639, 640, 643, 636, 653, 652, 687

(56) References Cited

U.S. PATENT DOCUMENTS

| | | | | |
|---|---|---|---|---|
| 4,396,458 A | * | 8/1983 | Platter et al. ............... | 216/19 |
| 5,562,801 A | | 10/1996 | Nulty | |
| 6,074,946 A | * | 6/2000 | Ouellet et al. .............. | 438/689 |
| 6,083,822 A | * | 7/2000 | Lee ............................ | 438/624 |
| 6,100,184 A | * | 8/2000 | Zhao et al. ................. | 438/638 |
| 6,169,029 B1 | | 1/2001 | Yang | |
| 6,303,459 B1 | * | 10/2001 | Chen .......................... | 438/401 |
| 6,337,269 B1 | * | 1/2002 | Huang et al. ............... | 438/618 |
| 6,350,700 B1 | * | 2/2002 | Schinella et al. .......... | 438/723 |
| 6,383,913 B1 | * | 5/2002 | Tsai et al. .................. | 438/624 |
| 6,440,853 B2 | * | 8/2002 | Allada et al. .............. | 438/687 |
| 6,455,417 B1 | * | 9/2002 | Bao et al. .................. | 438/637 |
| 6,465,340 B1 | * | 10/2002 | Wang et al. ................ | 438/622 |
| 6,475,905 B1 | * | 11/2002 | Subramanian et al. ...... | 438/637 |
| 6,475,929 B1 | * | 11/2002 | Garbriel et al. ........... | 438/783 |
| 6,486,059 B2 | * | 11/2002 | Lee et al. .................. | 438/637 |
| 6,489,233 B2 | * | 12/2002 | Chooi et al. ............... | 438/637 |
| 6,492,270 B1 | * | 12/2002 | Lou ............................ | 438/687 |
| 6,503,830 B2 | * | 1/2003 | Miyata ....................... | 438/637 |
| 2001/0029105 A1 | | 10/2001 | Seta et al. | |

FOREIGN PATENT DOCUMENTS

| | | | |
|---|---|---|---|
| EP | 0 260 201 A2 | | 3/1988 |
| EP | 0 855 737 A2 | | 7/1998 |
| EP | 1 033 745 A2 | | 9/2000 |
| JP | 404299572 A | * | 10/1992 |
| JP | 405136161 A | * | 6/1993 |
| JP | 406061359 A | * | 3/1994 |
| JP | 406112201 A | * | 4/1994 |
| JP | 406120215a | * | 4/1994 |

* cited by examiner

*Primary Examiner*—Matthew Smith
*Assistant Examiner*—Chuong A Luu
(74) *Attorney, Agent, or Firm*—Jacqueline J. Garner; W. James Brady, III; Frederick J. Telecky, Jr.

(57) ABSTRACT

An aluminum hardmask (106, 214) is used for etching a dielectric layer (102, 210). A fluorine-based etch is used that does not etch the aluminum hardmask (106, 210). The aluminum hardmask (106, 214) is then removed by CMP.

11 Claims, 2 Drawing Sheets

ALUMINUM HARDMASK FOR DIELECTRIC ETCH

FIELD OF THE INVENTION

The invention is generally related to the field of forming semiconductor devices and more specifically to hardmasks for dielectric etches, such as those used in forming copper interconnects.

BACKGROUND OF THE INVENTION

As semiconductor devices become more and more dense, it becomes more and more difficult to pattern the increasingly smaller geometries. This is especially true when forming dual damascene copper interconnects. In dual damascene copper interconnects, the dielectric is formed first. Interconnects are formed by etching the dielectric and then filling with appropriate barrier materials and copper. A trench is etched in an upper dielectric and a via is etched through a lower dielectric. The filled trench forms the interconnect lines/structures and filled vias provide connection to lower interconnect layers.

Vias and trenches typically have high aspect ratios. It can be difficult to etch high aspect ratio structures. One problem that occurs is that the pattern used for an etch tends to erode during the etch. An eroding pattern causes unacceptably high critical dimension (CD) variation.

SUMMARY OF THE INVENTION

The invention uses an aluminum hardmask for etching a dielectric layer. The aluminum hardmask is able to withstand the dielectric etch without etching.

An advantage of the invention is providing a method for patterning a dielectric layer with improved CD control.

This and other advantages will be apparent to those of ordinary skill in the art having reference to the specification in conjunction with the drawings.

DETAILED DESCRIPTION OF THE EMBODIMENTS

Figure 1A:
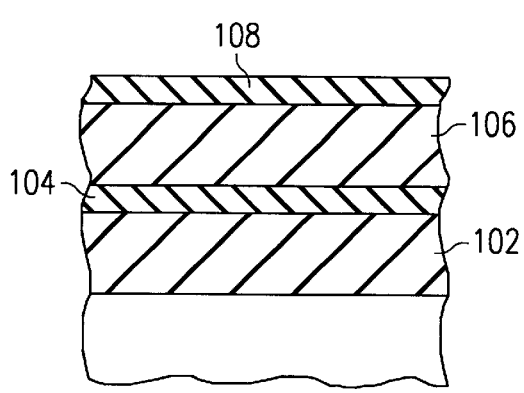
FIGS. 1A–1C are cross-sectional diagrams of a process for etching a dielectric using an aluminum hardmask according to an embodiment of the invention.

The invention uses an aluminum hardmask for etching a dielectric layer. Referring to FIG. 1A, a layer of aluminum 106 is formed over a dielectric layer 102. Aluminum layer 106 may alternatively include aluminum-alloys such as Al—Cu, Al—Pd, Al—Sc (all 0.5–2.0% Al-X by weight). Dielectric layer 102 may comprise one of many available dielectric materials. The invention is especially applicable to low-k dielectric materials such as organo-silicate glass (OSG) and polymer-based low-k materials. Many of these low-k materials require a cap layer. The cap layer may be used as an etch stop. In addition, many low-k dielectrics are hydrophilic (affinity for water) and the cap layer prevents the dielectric from picking up moisture. In this case, aluminum 106 is formed over the cap layer 104, if required. An antireflective coating (ARC) 108 is formed over aluminum 106.

Figure 1B:
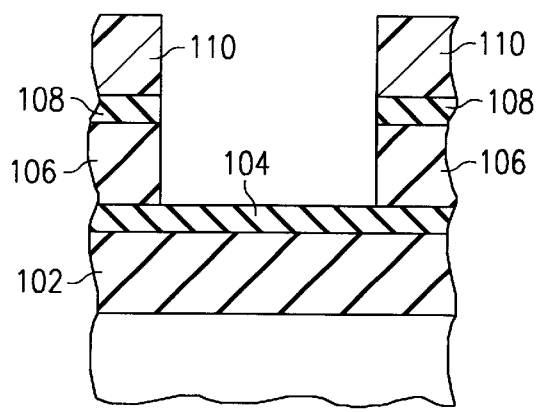

Referring to FIG. 1B, photoresist pattern 110 is formed over ARC 108. Using photoresist pattern 110, ARC 108 and aluminum 106 are etched to form a hardmask 112. The etch stops on cap layer 104, if present or dielectric layer 102 if a capping layer is not desired. As an example, a chlorine-based etch chemistry could be used. Photoresist pattern 110 is then removed.

Figure 1C:
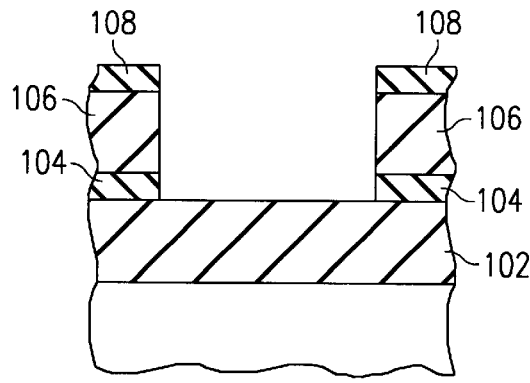

After pattern 110 is removed, the remaining cap layer 104 (if present) and dielectric layer 102 are etched where exposed by hardmask 112, as shown in FIG. 1C. Etches, such as a fluorine-plasma, are available for removing the dielectric layer 102 without etching the aluminum 106 in hardmask 112. Thus, CDs are preserved. Hardmask 112 may subsequently be removed by CMP or etch.

Figure 2A:
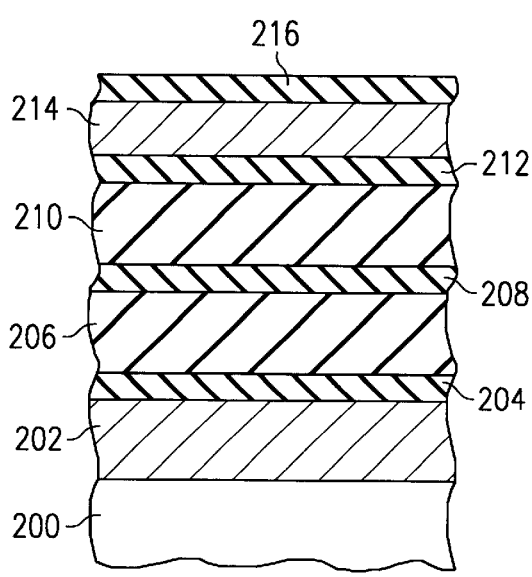
FIGS. 2A–2F are cross-sectional diagrams of a dual damascene copper interconnect process using an aluminum hardmask according to an embodiment of the invention.

A preferred embodiment of the invention will now be described in conjunction with a dual damascene copper interconnect process. Referring to FIG. 2A, a semiconductor body 200 is processed through the formation of at least one copper interconnect layer 202. Semiconductor body 200 may typically comprise a silicon substrate with transistors and other devices formed therein.

A barrier layer 204 is deposited over copper interconnect layer 202. Barrier layer 204 comprises a material that can block the diffuse of copper from copper interconnect layer 202 as well as act as an etch stop for etching a subsequently deposited low-k dielectric. For example, barrier layer 204 may comprise SiC or SiN. In the preferred example, barrier layer 204 is deposited to a thickness on the order of 1000 Å.

A bottom (or via level) dielectric 206 is deposited over barrier layer 204. A low-k (low dielectric constant) or ultra-low k dielectric is used for bottom dielectric 206. A variety of low-K and ultra low-K materials are known in the art. For example, an OSG or polymer-based low-k dielectric may be used. Bottom dielectric 206 is used for via interconnection between metal interconnect layer. In the preferred embodiment, bottom dielectric 206 is deposited to a thickness on the order of 4000 Å.

A stop layer 208 is deposited over bottom dielectric 206. Stop layer 208 is used as an etchstop as is described further below. For example, SiC or SiN may be used for the stop layer 208. A thickness on the order of 1000 Å is used.

A top (or trench level) dielectric 210 is deposited over stop layer 208. A low-k (low dielectric constant) or ultra-low k dielectric is also used for top dielectric 210. Metal interconnect layers are formed in trenches in top dielectric 210. In the preferred embodiment, top dielectric 210 is deposited to a thickness on the order of 4000 Å.

The thickness of the various materials may vary between technologies. For example, the thickness of top dielectric 210 and bottom dielectric 206 are set by the desired metal thicknesses for the device.

A cap layer 212 is deposited over top dielectric 210. Cap layer 212 may comprise an oxide. Cap layers are typically used over low-k and ultra low-k dielectrics to provide an etchstop and to protect hydrophilic low-k materials from moisture. As an example, a 500 Å PETEOS (plasma enhanced tetraethyoxysilane) layer may be used.

According to the invention, a layer of aluminum 214 is deposited over cap layer 212. Aluminum 214 may be deposited to a thickness on the order of 1000 Å. An ARC (anti-reflective coating) 216 is deposited over aluminum 214. ARCs such as ARC 216 are typically used under resist patterning materials. As an example, a 300 Å layer of SiON may be used for ARC 216.

Aluminum 214 (and ARC 216) will be used as a hardmask in subsequent etching steps described below. The use of aluminum adds the advantage of forming a hardmask that will not etch in a fluorine plasma. Fluorine plasmas are typically used when etching the top and bottom dielectrics 210 and 206. Because the aluminum does not etch, CDs (critical dimensions) are preserved.

Figure 2B:
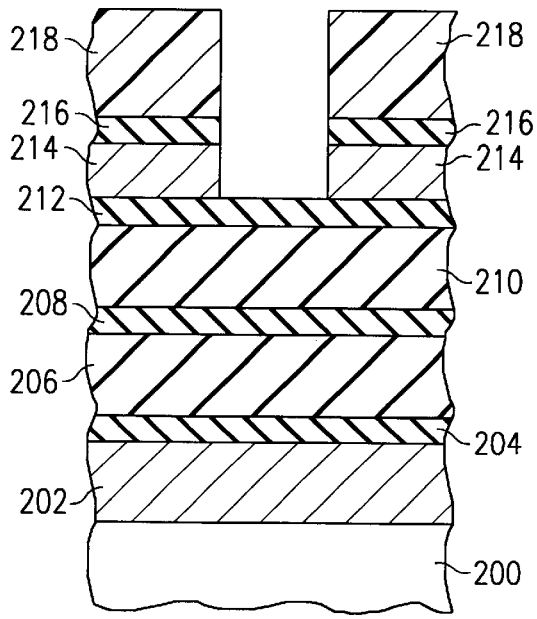

Referring to FIG. 2B, a trench pattern 218 is formed over ARC 216. Trench pattern 216 defines the area where trenches will be formed in top dielectric 210 and where metal interconnect lines with subsequently be formed. Using trench pattern 218, ARC 216 and Aluminum 214 are etched. For example, a chlorine-based etch may be used. The etch stops of cap layer 212. For this reason, cap layer 212 should comprise a material (e.g., silicon-dioxide) such that Aluminum 214 and ARC 216 may be etched selectively with respect to cap layer 212. After the etch, trench pattern 218 is removed, preferably in situ.

Figure 2C:
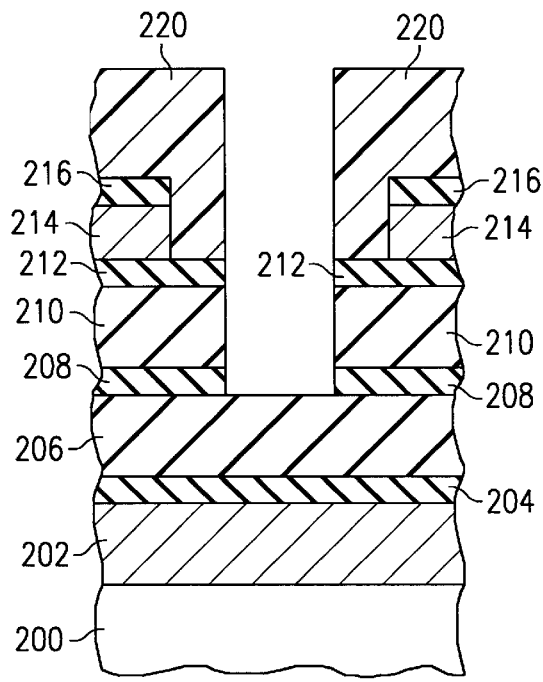

Next, via pattern 220 is formed over ARC 216 and cap layer 212, as shown in FIG. 2C. Via pattern 220 exposes the area where vias to underlying metal interconnect layers, such as copper interconnect 202, are desired. Using via pattern 220, the cap layer 212 and top dielectric 210 are etched stopping on stop layer 208. Then, stop layer 208 is etched using, for example, an etch chemistry comprising $Ar/O_2/C_xF_y$ (fluoro-carbon). After the etch, via pattern 220 is removed, preferably in situ.

Figure 2D:
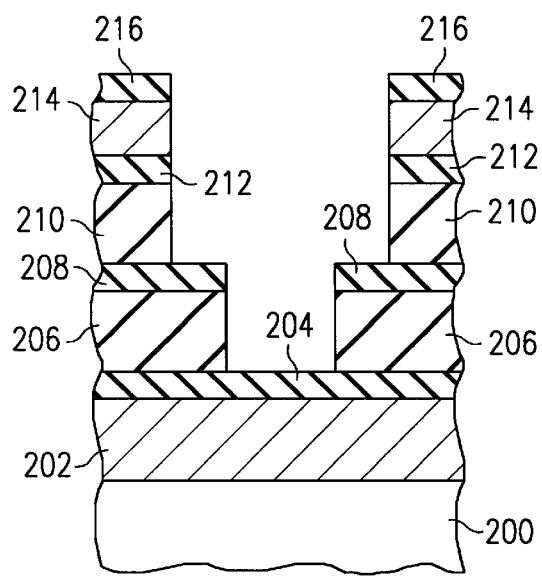

After removing the via pattern 220, the trench 222 and bottom half of via 224 are etched, as shown in FIG. 2D. Trench 222 is etched through cap layer 212 and top dielectric 210. Via 224 is etched through bottom dielectric 206. Typically, a fluorine-based etch is used. Aluminum 214 serves as the hardmask for the trench and thus, defines the trench dimension. Because aluminum 214 does not etch during a fluorine-based etch, the CD of the trench is preserved throughout the etch. Stop layer 208 serves as the hard mask for the via and thus, defines the via dimension. The etch stops on stop layer 208 in the trench area and on barrier layer 204 in the via area. For this reason, stop layer 208 and barrier layer 204 comprise materials such that the top and bottom dielectrics 210 and 206 may be etched selectively with respect to the materials of stop layer 208 and barrier layer 204.

Figure 2E:
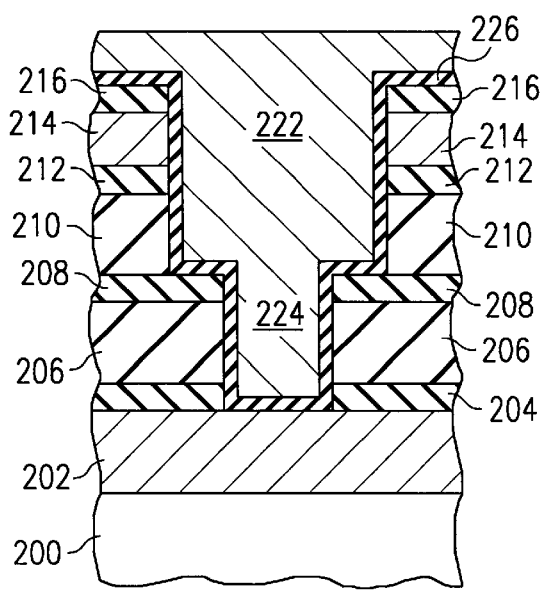

Referring to FIG. 2E, the barrier layer 204 at the bottom of via 224 is removed, by etching, to expose copper from copper interconnect 204. Then, a copper barrier 226 is formed on the surfaces of the trench 222 and via 224. Various copper barriers are known in the art. For example, Ta, TaN, or a combination thereof may be used. Next, a copper seed layer is formed followed by copper ECD to fill trench 224 and via 222 with copper.

Figure 2F:
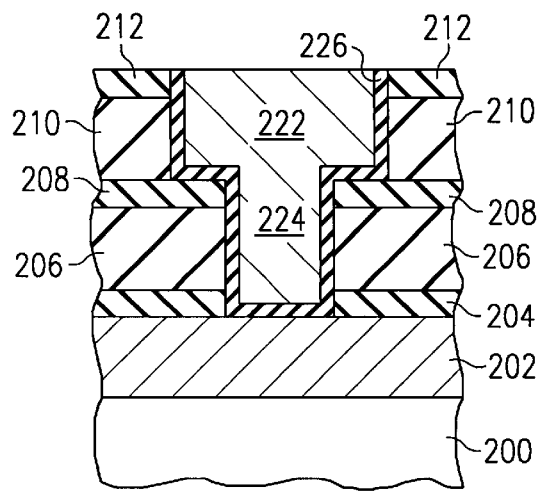

After copper ECD, the structure is chemically-mechanically polished Aluminum 214 is also removed, either by this CMP or by a subsequent etch. The resultant structure is shown in FIG. 2F.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, comprising the steps of:
   providing a semiconductor body having a first copper interconnect layer, a barrier layer, a bottom dielectric, a stop layer, a top dielectric, and a cap layer formed thereon;
   forming an aluminum hardmask in a trench pattern over said cap layer;
   then, forming a via resist pattern over said aluminum hardmask and said cap layer;
   etching said top dielectric and said stop layer as defined by said via resist pattern;
   removing said via resist pattern;
   forming a trench in said top dielectric as defined by said aluminum hardmask and a via in said bottom dielectric as defined by said stop layer;
   removing said barrier layer at a bottom of said via;
   filling said via and said trench with a copper barrier and copper; and
   chemically-mechanically polishing said copper and said copper barrier to form a second copper Interconnect layer.

2. The method of claim 1, wherein said step of forming an aluminum hardmask comprises the step of:
   depositing a layer of aluminum over said cap layer;
   depositing an antireflective coating over said layer of aluminum;
   forming a trench resist pattern over said antireflective coating;
   etching said antireflective coating and said layer of aluminum to form said aluminum hardmask; and
   removing said trench resist pattern.

3. The method of claim 2, wherein said etching said antireflective coating and said layer of aluminum comprises a chlorine based etch.

4. The method of claim 1, wherein said step of forming a trench and a via comprises etching with a fluorine-based chemistry.

5. The method of claim 1, wherein said aluminum hardmask is removed by said chemically-mechanically polishing step.

6. The method of claim 1, wherein said aluminum hardmask is removed by etching.

7. The method of claim 1, wherein said stop layer comprises SiN.

8. The method of claim 1, wherein said stop layer comprises SiC.

9. The method of claim 1, wherein said cap layer comprises an oxide.

10. The method of claim 1, wherein said top dielectric and said bottom dielectric comprise a material selected from the group consisting of low-k and ultra low-k dielectrics.

11. The method of claim 1, wherein said top dielectric and said bottom dielectric comprise organo-silicate glass.

* * * * *